United States Patent
Shimizu et al.

(10) Patent No.: US 6,941,648 B2
(45) Date of Patent: Sep. 13, 2005

(54) METHOD FOR PRODUCING PRINTED WIRING BOARD

(75) Inventors: Kazuhiro Shimizu, Ishikawa (JP); Nobuo Komatsu, Tokyo (JP); Soichiro Kishimoto, Tochigi (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/364,331

(22) Filed: Feb. 12, 2003

(65) Prior Publication Data

US 2003/0116345 A1 Jun. 26, 2003

Related U.S. Application Data

(62) Division of application No. 09/793,978, filed on Feb. 28, 2001, now Pat. No. 6,570,098.

(30) Foreign Application Priority Data

Mar. 6, 2000 (JP) .................................... P2000-065775

(51) Int. Cl.[7] .............................................. H05K 3/36
(52) U.S. Cl. ............................. 29/830; 29/831; 29/829; 29/846; 29/847; 29/852; 174/262; 428/901
(58) Field of Search .................... 29/829–834, 840, 29/852, 846; 428/209, 901; 361/749–751; 174/254, 255, 155–158, 257–266; 257/774

(56) References Cited

U.S. PATENT DOCUMENTS

| | | | |
|---|---|---|---|
| 5,046,238 A | * | 9/1991 | Daigle et al. ................. 29/830 |
| 5,342,207 A | | 8/1994 | Sobhani |
| 5,601,678 A | | 2/1997 | Gerber et al. |
| 5,888,627 A | * | 3/1999 | Nakatani ..................... 29/830 |
| 6,026,564 A | * | 2/2000 | Wang et al. ................. 29/830 |
| 6,163,957 A | | 12/2000 | Jiang et al. |
| 6,326,555 B1 | | 12/2001 | McCormack et al. |
| 6,570,098 B2 | * | 5/2003 | Shimizu et al. ............. 174/255 |
| 6,839,964 B2 | * | 1/2005 | Henson ....................... 29/852 |

* cited by examiner

Primary Examiner—Minh Trinh
(74) Attorney, Agent, or Firm—Rader, Fishman & Grauer PLLC; Ronald P. Kananen

(57) ABSTRACT

A method for making a printed wiring board reduced in weight by reducing the size and the thickness of a substrate in its entirety. The printed wiring board includes a rigid substrate 2, comprised of a core material 11 at least one side of which carries a land 23, and flexible substrates 3, 4, 5, and 6 comprised of core materials 33, 36 on at least one surface of which a bump 32 for electrical connection to the land 38 is formed protuberantly. The rigid substrate 2 and the flexible substrates 3 to 6 are molded as one with each other, with the interposition of an adhesive in-between, so that the land and the bump face each other.

25 Claims, 11 Drawing Sheets

METHOD FOR PRODUCING PRINTED WIRING BOARD

This application is a Divisional of application Ser. No. 09/793,978, filed on Feb. 28, 2001, now U.S. Pat. No. 6,570,098.

BACKGROUND OF THE INVENTION

1. Field of the Invention

This invention relates to a printed wiring board having a rigid substrate as a core material, and on at least one surface of which is layered a flexible substrate, and to a manufacturing method for the printed wiring board.

2. Description of Related Art

Among the printed wiring boards, known so far, there are a so-called rigid substrate, carrying a tough core material, formed e.g., of a glass epoxy resin, with the core material carrying a wiring pattern, and a so-called flexible substrate, having a flexible core material carrying a wiring pattern.

Meanwhile, in a portable high-performance electronic equipment, such as a digital mobile equipment, in which a demand is raised for increasing the transmission rate and the memory capacity, there is also raised a demand for reducing the size and weight of the equipment in order to improve its portability. In keeping up with this demand, it is required of the printed wiring board to increase the number of I/O pins and to reduce the weight of semiconductor.

Among the aforementioned printed wiring boards, there is a multi-layered printed wiring board having plural substrates layered together and plural electrically conductive layers.

However, in a multi-layered rigid substrate, a through-hole needs to be bored in each substrate for establishing electrical connection across the respective conductive layers. If this through-hole is formed, the conductive layer provided on the core material and the inner wall surface of the through-hole need to be plated. For this reason, in a multi-layered rigid substrate, the copper foils, forming the respective conductive layers, cannot be reduced in thickness, so that difficulties are encountered in further reducing the thickness and weight of the entire substrate or in forming fine patterns thereon. Moreover, in the multi-layered rigid substrate, a wiring pattern is formed on each surface of the core material, a further core material is bonded on each surface of the core material, now carrying the wiring pattern, and a wiring pattern is formed on the so-bonded core materials. Thus, if malfunctions occur in the course of the manufacturing process, the substrates bonded previously need to be discarded in their entirety, thus decreasing the yield to render it difficult to improve the production efficiency or to reduce the production cost.

SUMMARY OF THE INVENTION

It is therefore an object of the present invention to provide a printed wiring board which can be reduced in weight by reducing the size and the weight of the entire substrate, and a method for producing this printed wiring board.

In one aspect, the present invention provides a printed wiring board including a rigid substrate having a land on at least one surface of a core material, and a flexible substrate including a bump, protuberantly formed on at least one surface of an insulating layer, for establishing electrical connection to the land, and a land on its other surface, in which the rigid substrate and the flexible substrate are molded as one with each other, with the interposition of an adhesive in-between, so that the land and the bump face each other.

In another aspect, the present invention provides a method for producing a printed wiring board including the steps of forming a rigid substrate including a land on at least one surface of a core material, forming a flexible substrate including a bump, protuberantly formed on at least one surface of an insulating layer for establishing electrical connection to the land, and a land on its other surface, and molding the rigid substrate and the flexible substrate together by vacuum hot pressuring, with the interposition of an adhesive in-between, so that the land and the bump face each other.

In the printed wiring board according to the present invention, in which a flexible substrate is layered on at least one surface of a rigid substrate exhibiting toughness, it is possible to provide more circuits than is possible with a layered rigid substrate, thus enabling the entire device to be reduced in size. The printed wiring board is produced by bonding a flexible substrate to the rigid substrate exhibiting toughness, so that bonding may be easier than if flexible substrates are bonded together. Moreover, with the present printed wiring board, obtained on bonding the rigid substrate and the flexible substrate, carrying completed respective wiring patterns, electrical connection can be made to any desired layer in contradistinction from the case of a multi-layered rigid substrate where there are provided plural conductive layers.

In addition, in the method for producing the printed wiring board, according to the present invention, the technique of forming wiring patterns on both surfaces of the core material, bonding further core materials on both sides of the first-stated core material, now carrying the wiring patterns, and forming further wiring patterns on the second-stated core materials, as in the case of the conventional method for producing a multi-layered rigid substrate, is not used, each substrate which is to make up the printed wiring board may be bonded in position after inspection, thus improving the production yield. Moreover, since the number of times of plating operations for the copper foil for the flexible substrates is lesser than that for the rigid substrate, the flexible substrates may be of lesser thickness than the rigid substrate. Since the printed wiring board is produced by layering these flexible substrates, it can be of a lesser thickness than the layered rigid substrate.

BRIEF DESCRIPTION OF THE DRAWINGS

FIG. 7B being a cross-sectional view schematic view showing the state in which the copper foil has been etched to form a wiring pattern and bumps; and FIG. 7C being a cross-sectional view schematically showing the state in which a first plating layer is formed on the copper foil surface, FIG. 8C being a cross-sectional view schematically showing the state in which the resist is removed after light exposure and development and the distal end of the bump is protruded from polyamic acid 33a.

FIG. 9B being a cross-sectional view schematically showing the state in which a further carrier film is bonded to the surface carrying the bump; and FIG. 9C being a cross-sectional view schematically showing the state in which a wiring pattern having a patterned copper foil is formed.

FIG. 10B being a cross-sectional view schematically showing the state in which polyamic acid has been patterned; and FIG. 10C being a cross-sectional view schematically showing the state in which the polyamic acid is turned into imide to form a first insulating layer composed of polyimide.

DESCRIPTION OF THE PREFERRED EMBODIMENTS

Figure 1:
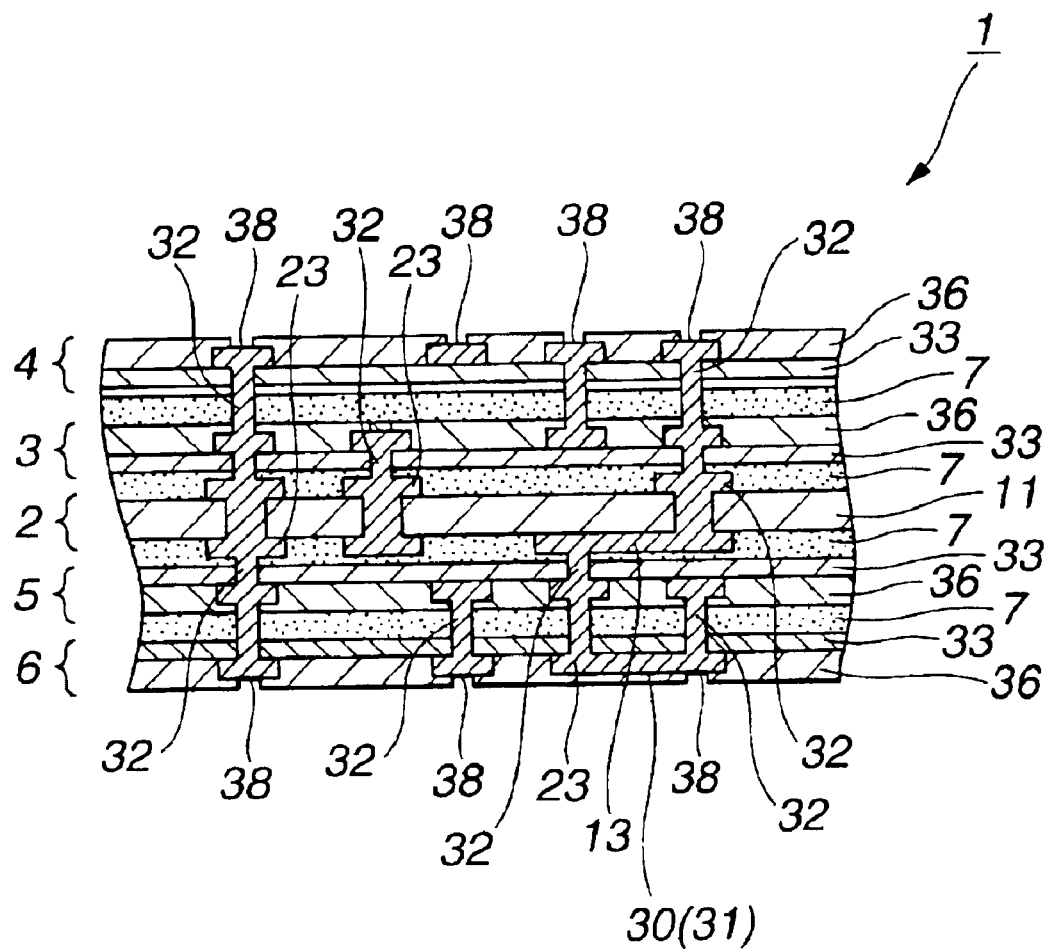
FIG. 1 is a cross-sectional view showing essential portions of a printed wiring board embodying the present invention.

Referring to the drawings, a printed wiring board and a manufacturing method therefor, according to the present invention, will be explained in detail.

Figure 2:
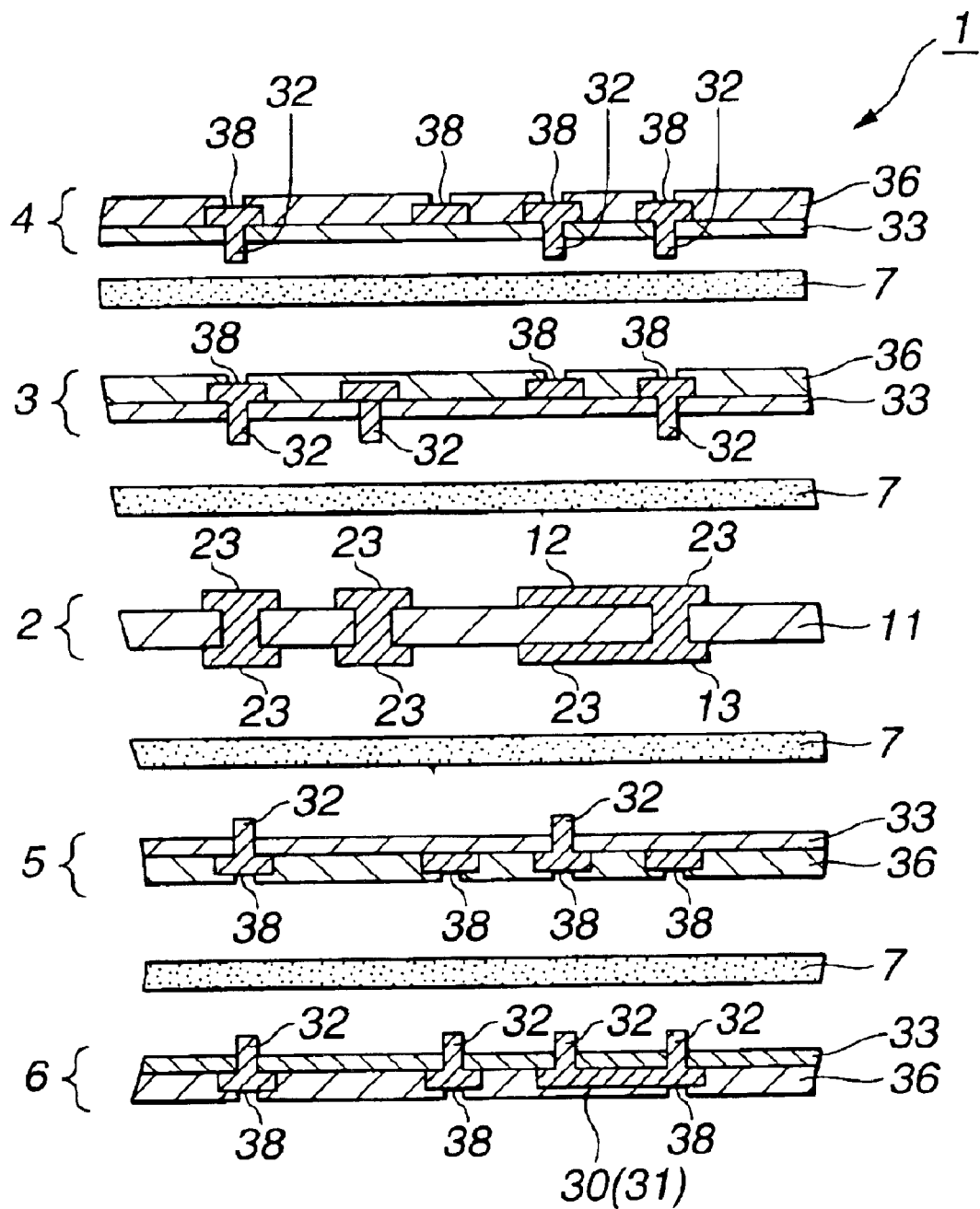
FIG. 2 is an exploded cross-sectional view schematically showing the state of a printed wiring board embodying the present invention.

Referring to FIGS. 1 and 2, a rigid substrate 2 is used as a core material, on one surface of which flexible substrates 3, 4 are layered, and on the other surface of which flexible substrates 5, 6 are layered. That is, the flexible substrates 3, 5 prove inner layer substrates, bonded to the rigid substrate 2, whilst the flexible substrates 4, 6 prove outer layer substrates, bonded to the flexible substrates 3, 5.

Figure 3:
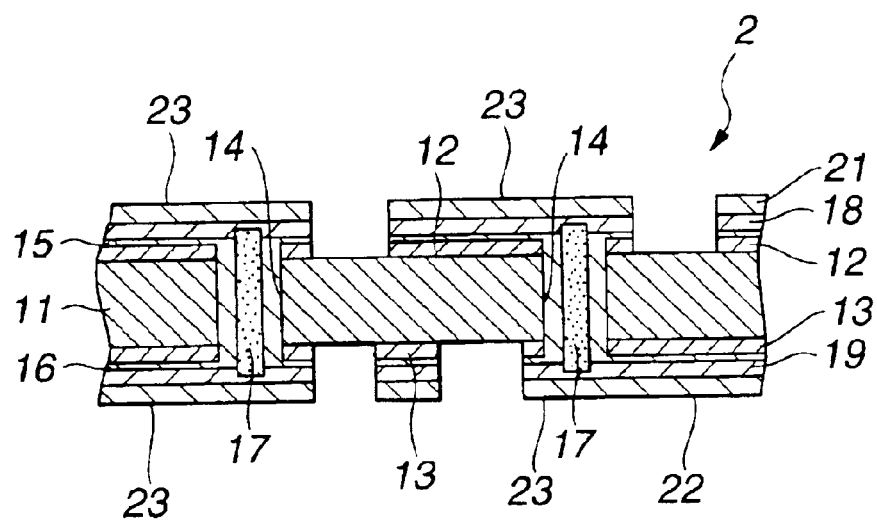
FIG. 3 is a cross-sectional view showing essential portions of a rigid substrate forming the printed wiring board.

The rigid substrate 2 includes a core material 11, as shown in FIG. 3. This core material 11 is a tough substrate formed by impregnating a glass cloth with an epoxy resin. For this core material, a combustion retardant compound, mainly composed of nitrogen or phosphorus, is used in place of a halogen compound, such as bromine compound. On both sides of the core material 11 are formed wiring patterns 12, 13 comprised of copper foils. In the core material 11, carrying the wiring patterns 12,13, there are formed through-holes 14, 14 for establishing electrical connection of the wiring patterns 12, 13 formed on the respective surfaces of the core material 11. On the wiring patterns 12, 13, formed on the respective surfaces of the core material 11, and on the inner wall surfaces of the through-holes 14, 14, there are formed first plating layers 15, 16, such as by an electrolytic copper plating method or an electroless copper plating method. In the through-holes 14, 14, provided with the first plating layers 15, 16, an insulating resin 17, for example, is charged to flatten out the surface of the rigid substrate 2. That is, in the rigid substrate 2, the through-hole 14 is charged to provide for reliable contact of bumps of the flexible substrates 3, 5 layered on the respective surfaces, while assuring positive bonding of the flexible substrates 3, 5.

On the first plating layers 15, 16, there are formed second plating layers 18, 19 for forming an electrically conductive layer even on each surface of the insulating resin 17 charged into the through-holes 14, 14. The second plating layers 18, 19 are provided on the surface of the resin 17 to provide for positive electrical connection to the bumps of the flexible substrates 3, 5. Although the resin 17 here is insulating, an electrically conductive material may be charged in order to provide for more reliable electrical connection of the paste-like wiring patterns 12, 13. On the second plating layers 18, 19, there are formed third conductive layers 21, 22 formed by gold plating still higher in electrically conductivity. In the rigid substrate 2, constructed as described above, the portions lying above the through-holes 4, 4 operate as lands 23, 23 adapted for being electrically connected to the bumps of the flexible substrates 3, 5.

Since the rigid substrate 2, constructed as described above, is a tough substrate, flexible substrates 3, 4 , 5 and 6 can be easily bonded to its both surfaces, with the rigid substrate 2 as a core material.

The flexible substrates 3, 4 , 5 and 6, layered on the rigid substrate 2, as described above, are constructed in the following manner. Since the flexible substrates 3, 4, 5 and 6 are of a similar structure, the flexible substrate 3, layered on one surface of the rigid substrate 2, is explained as an example.

Figure 4:
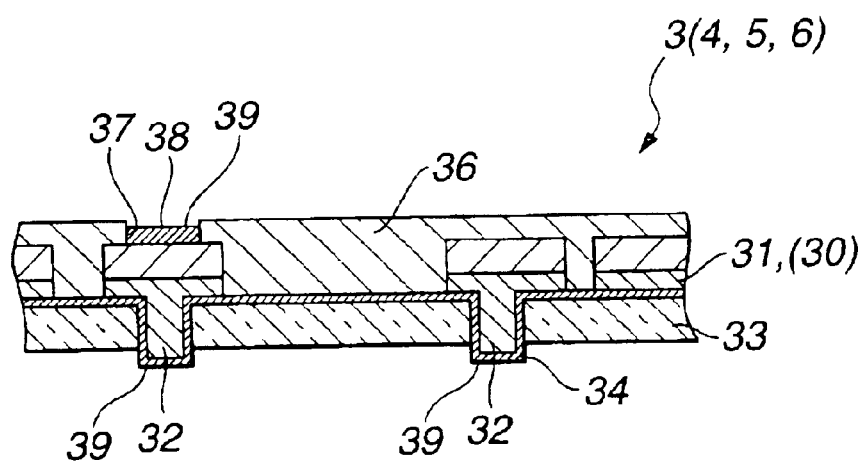
FIG. 4 is a cross-sectional view showing essential portions of a flexible substrate forming the printed wiring board.

This flexible substrate 3 has a copper foil 31, proving a wiring pattern 30, as shown in FIG. 4. On one surface of the copper foil 31 is formed a first insulating layer 33 formed of a combustion retardant material, such as polyimide. On the copper foil 31 is formed a first plating layer 34, by nickel plating, for improving the tightness in contact with respect to the first insulating layer 33 formed of polyimide. On the other surface of the copper foil 31 is formed a second insulating layer 36 formed e.g., of polyimide. The second insulating layer 36 is patterned to form an opening 37 for exposing the copper foil 31 to outside to form lands 38, 38 thereat. On the distal ends of bumps 32, 32 exposed to outside by the first insulating layer 33, and on the surfaces of the lands 38, 38, there are formed second plating layers 39, 39 by gold plating superior in electrically conductivity. As for the flexible substrate 3, reference is had to the corresponding Japanese application by the present inventors (Japanese patent Application 2000-210482).

The lands 38, 38 are provided on the other surface of the copper foil 31 and specifically are provided e.g., at locations facing the bumps 32. Referring to FIGS. 1 and 2, the bumps 32, 32 of the flexible substrates 3, 5 are connected to the lands 23, 23 of the rigid substrate 2, while the bumps 32, 32 of the flexible substrates 4, 6 are connected to the lands 38, 38 of the flexible substrates 3, 5 layered on the rigid substrate 2. On the lands 38, 38 of the flexible substrates 4, 6, forming the outer layers, electronic parts, such as IC chips, are mounted.

The adhesion of the rigid substrate 2 to the flexible substrates 3, 5, that of the flexible substrates 3, 4 and that of the flexible substrates 5, 6 are by adhesives 7, 7, 7, 7, as shown in FIGS. 1 and 2. These substrates 2 to 6 are unified together by vacuum hot press. Since the solder temperature of the solder reflow in mounting electronic components reaches approximately 230° C., an adhesive having superior thermal resistance is used as the adhesives 7, 7, 7, 7. Specifically, an epoxy acrylic adhesive, not employing halogen compounds in order to display thermal resistance and in order not to emit toxic substances on incineration, is used as the adhesive 7. The adhesives 7, 7, 7, 7 are formed to a thickness on the order of 12 to 25 $\mu$m. That is, if the thickness of the adhesive 7 is less than 12 $\mu$m, sufficient adhesion strength of the substrate cannot be developed, whereas, if it is thicker than 25 $\mu$m, the bumps 32, 32 are not protruded from the adhesive 7, such that electrical connection to the lands 23, 38 cannot be realized. Moreover, when cured, the adhesives 7, 7, 7, 7 are cured and contracted in the direction of thickness to draw the neighboring substrates in a direction of approaching each other to assure reliable connection between the land and the bump.

Since the printed wiring board I is comprised of flexible substrates 3 to 6 layered on both surfaces of the rigid substrate 2 exhibiting toughness, fine patterns can be formed on the flexible substrates 3, 4 , 5, 6 to form more circuits to reduce the overall size. Also, since the printed wiring board 1 is prepared by bonding the flexible substrates 3 to 6 to the rigid substrate 2 exhibiting toughness, bonding may be easier than if the flexible substrates are bonded to one another. In addition, since the flexible substrates 3 to 6 of the printed wiring board 1 are bonded to the rigid substrate 2 having the completed wiring pattern thereon, as will be explained subsequently, electrical connection can be made freely to any layer in distinction from the case of the multi-layered rigid substrate 2 having plural conductive layers. Moreover, since the flexible substrates 3 to 6 are layered in the present printed wiring board 1 on the rigid substrate 2, the printed wiring board can be reduced in thickness in its entirety.

Moreover, since the through-hole 4 of the rigid substrate 2 of the printed wiring board 1 is charged with the resin 17, the surfaces of the flexible substrates 4, 6 are flattened out to assure facilitated mounting of the electronic components. In addition, since no halogen compound is used in this printed wiring board 1 as the combustion retardant material for the core material 11 of the rigid substrate 2, and polyimide is used in place of the halogen compounds for the flexible substrates 3 to 6, while no halogen compound is used as the adhesive 7, it is possible to generate prevent toxic substances from being produced on incineration.

The method for producing the above-described printed wiring board 1 is explained with reference to the drawings. In this printed wiring board 1, the flexible substrates 2 to 6 are produced separately from one another, as shown in FIG. 2.

Figure 5A:
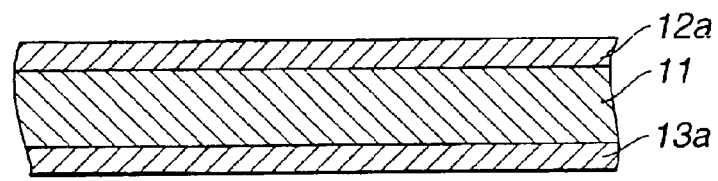
FIGS. 5A, 5B and 5C illustrate the manufacturing process for a rigid substrata, FIG. 5A being a cross-sectional view showing essential portions of a core material, on both sides of which are provided copper foils, FIG. 5B being a cross-sectional view schematically showing the state in which a through-hole is formed in the core material, and the copper foil is etched, and FIG. 5C being a cross-sectional view schematically showing the state in which a first plating layer is formed on the copper wire.

The manufacturing method for the rigid substrate 2, serving as a core of the printed wiring board 1, is first explained. This core material 11 is a tough substrate formed by impregnating a glass cloth with an epoxy resin, as shown in FIG. 5A. For this core material, a combustion retardant compound, mainly composed of nitrogen or phosphorus, is used in place of a halogen compound, such as bromine compound, .so that no toxic substance is produced on incineration. On both surfaces of the core material 11 are bonded conductive layers 12a, 13a for forming wiring patterns 12,13. These conductive layers 12a, 13a are formed by copper foils each being 12 $\mu$m in thickness.

Figure 5B:
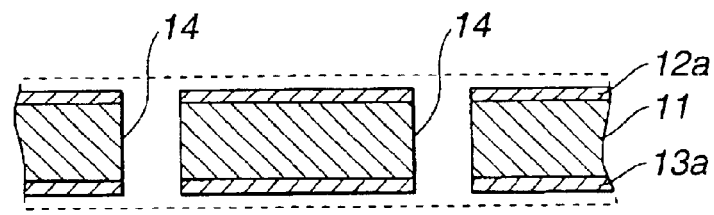
Figure 5C:
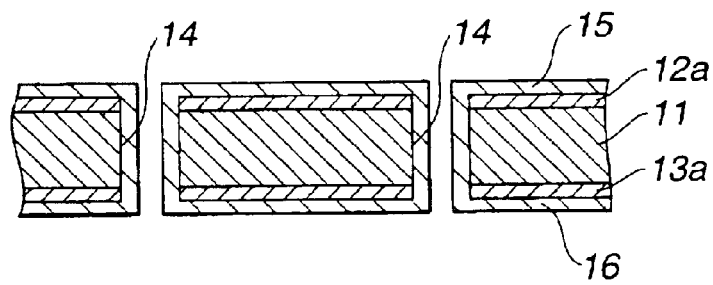

In the core material 11, carrying the conductive layers 12a, 13a, through-holes 14, 14 for establishing electrical connection between the conductive layers 12a, 13a are formed by a drill unit having a drill diameter of 0.2 mm, as shown in FIG. 5B. The core material 11, now carrying the through-holes 14, 14, is then subjected to high-pressure water rinsing to remove burrs left in the through-holes 14, 14. Then, chemical smear removal is carried out to remove burrs in the through-holes 14, 14 not removed by the high pressure water rinsing. For example, deburring in the through-holes 14, 14 is carried out by a sulfuric acid method, a chromic acid method, or by a permanganate method. Meanwhile, this chemical smear removal process can be omitted if smear can be sufficiently removed by the aforementioned high pressure rinsing. In the core material 11, having the burrs in the through-holes 14, 14 removed sufficiently, the conductive layers 12a, 12a are soft-etched in order to reduce the thickness of the rigid substrate 2 and in order to form fine patterns.

On the conductive layers 12a, 13a, now having the through-holes 14, 14 formed therein, the first plating layers 15, 16 are formed by electrolytic copper plating method or by the electroless copper plating method, in order to provide for electrical connection of the conductive layers 12a, 13a, as shown in FIG. 15C. The first plating layers 15, 16 are formed to a thickness of approximately 10 $\mu$m so that the thickness of the conductive layers 12a, 13a and the first plating layers 15, 16 combined together will be approximately 22 $\mu$m.

Figure 6A:
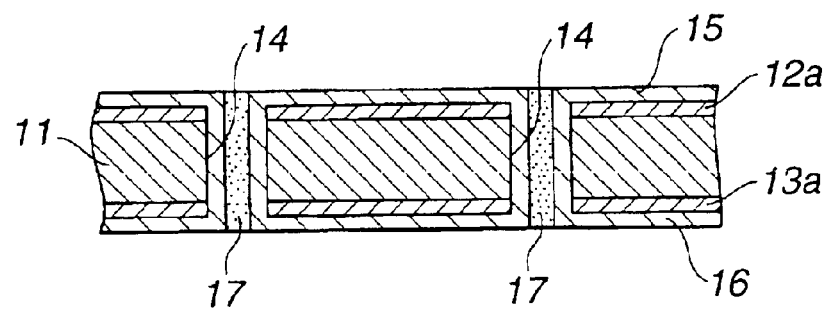
FIGS. 6A, 6B and 6C illustrate the manufacturing process of a rigid substrate, FIG. 6A being a cross-sectional view showing essential portions of the core material carrying copper foils on both substrate sides, FIG. 6B being a schematic cross-sectional view showing the state in which a through-hole is bored in the core material and a copper foil is etched, FIG. 6C being a cross-sectional view schematically showing the state in which a second plating layer is formed on the first plating layer for stopping the resin.

Then, as shown in FIG. 6A, an insulating resin 17 is charged into the through-holes 14, 14 of the core material 11, now carrying the first plating layers 15, 16, in order to flatten out the surface of the core material 11. Thus, in the rigid substrate 2, the through-holes 14, 14 are buried with the resin 17 to flatten out the surface of the core material 11 to assure reliable contact with the bumps 32, 32 of the flexible substrates 3, 5 on the through-holes 14, 14. The paste-like conductive material may be charged into the through-holes 14, 14 to assure more reliable electrical connection of the wiring patterns 12, 13.

Figure 6B:
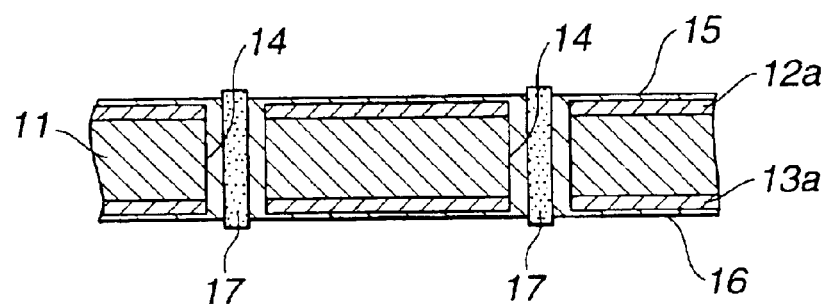

Then, as shown in FIG. 6B, the first plating layers 15, 16 are soft-etched to reduce the thickness of the rigid substrate 2 as well as to form a fine pattern. Specifically, the first plating layers 15, 16 are soft-etched so that the thicknesses of the conductive layers 12a, 13a and the first plating layers 15, 16, combined together, will be approximately 17 $\mu$m.

Figure 6C:
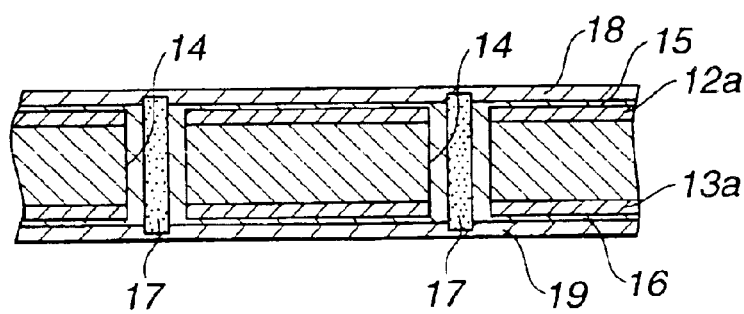

Then, as shown in FIG. 6C, the second plating layers 18, 19 are formed on the soft-etched first plating layers 15, 16, by the electrolytic copper plating method or the electroless copper plating method, in order to form an electrically conductive layer on the resin 17 charged into the through-holes 14, 14 to assure positive electrical connection with the bumps 32, 32 of the flexible substrates 3, 5. Specifically, the second plating layers 18, 19 are formed to a thickness of approximately 10 µm so that the overall thickness of the second plating layers 18, 19 will be approximately 17 to approximately 27 µm.

Figure 6D:
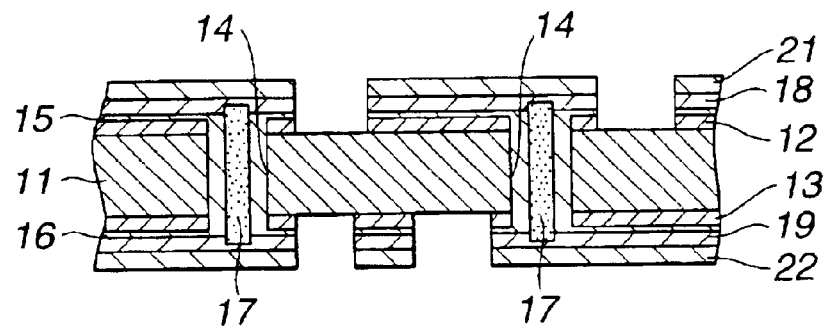
FIG. 6D being a cross-sectional view schematically showing the state in which a third plating layer is formed on the second plating layer.

Then, as shown in FIG. 6D, a dry film is stuck to the core material 11, now carrying the second plating layers 18, 19, exposed to light, developed and etched by way of performing the patterning. The second plating layers 18, 19 are plated with gold, exhibiting superior electrically conductivity, as shown in FIG. 3, to form third conductive layers 21, 22. This forms lands 23, 23 of the bumps 32, 32 of the flexible substrates 3, 5. The surfaces of the third conductive layers 21, 22 then are subjected to the processing of surface oxidation, using a solvent, by way of blacking, in order to improve the tightness in contact with the adhesive 7 used for bonding the flexible substrates 3, 5. In the printed wiring board 1, the rigid substrate 2, thus completely patterned, is used as the core material, the flexible substrates 3, 4 are layered on one surface of the rigid substrate 2, whilst the flexible substrates 5, 6 are layered on the other surface of the rigid substrate 2.

The manufacturing method for the flexible substrates 3 to 6, layered on the rigid substrate 2, will now be explained for the flexible substrate 3, by way of an example. As for the manufacturing method for the flexible substrate 3, reference is had to the corresponding Japanese applicant by the present inventors (Japanese patent Application 2000-210482).

Figure 7A:
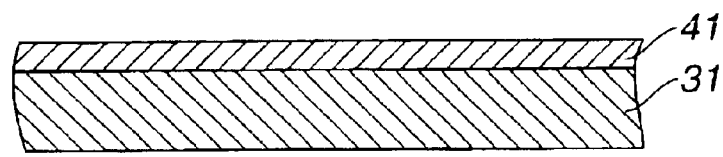
FIGS. 7A, 7B and 7C illustrate a manufacturing process for a flexible substrate, FIG. 7A being a cross-sectional view schematically showing the state in which a copper film is formed on a carrier film.

First, as shown in FIG. 7A, a copper foil 31 for forming a wiring pattern 30 or bumps 32 is stuck to a carrier film 41. Since the copper foil 31 by itself is puckered or severed, the carrier film 41 is used as a protective film for the copper foil 31 to prevent this from occurring. For example, the carrier film 41 is formed of a synthetic resin material, such as polyethylene terephthalate, to a thickness of approximately 200 µm. On this carrier film 41, a copper foil with a thickness of approximately 55 µm is stuck by a UV curable adhesive with a thickness of approximately 40 µm. When bonding the copper foil 31 to the carrier film 41, the UV light is illuminated in an amount of 50% on the surface of the copper foil 31 and in an amount of 30% on the surface of the carrier film 41. That is, the surface of the carrier film 41 is in the semi-cured state to enable the carrier film 41 to be peeled off in a subsequent process.

Figure 7B:
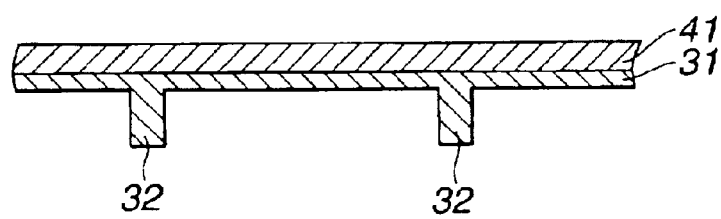

Then, as shown in FIG. 7B, a dry film is stuck to the copper foil 31, bonded to the carrier film 41, exposed to light and etched by way of patterning. This forms protuberant bumps 32 on the copper foil 31. Since the bumps 32 are formed by etching the copper foil 31, it is possible to reduce height variations. The surface of the copper foil 31 carrying the bumps 32, 32 are roughed, using a solvent, for improving the tightness of contact with the first plating layer 34 of nickel (Ni) formed in the next step.

Figure 7C:
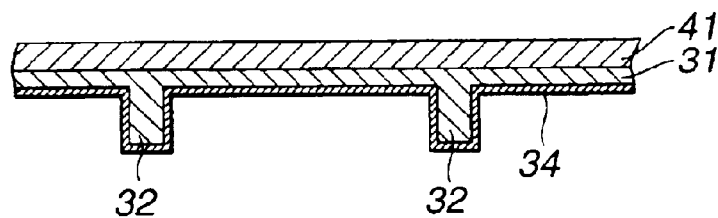

Then, as shown in FIG. 7C, the first plating layer 34 is formed on the entire surface of the copper foil 31, carrying the bumps 32, in order to improve tightness of contact with the first insulating layer of polyimide as the core material of the flexible substrate 3. Specifically, this first plating layer 34 is formed to a thickness of approximately 1 µm.

Figure 8A:
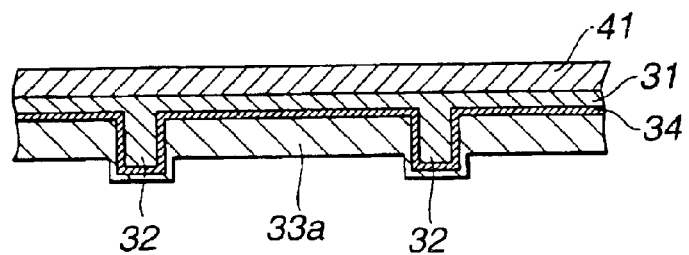
FIGS. 8A, 8B and 8C illustrate the manufacturing process of the flexible substrate, FIG. 8A being a cross-sectional view schematically showing the state in which a resist is coated on polyamic acid.

On the first plating layer 34, polyamic acid 33a is coated, as shown in FIG. 8A. This polyamic acid 33a is coated on the first plating layer 34 to a thickness of approximately 200 µm and dried until it is semi-cured. This gives the thickness of the as-dried polyamic acid 33a equal to approximately 20 µm.

Figure 8B:
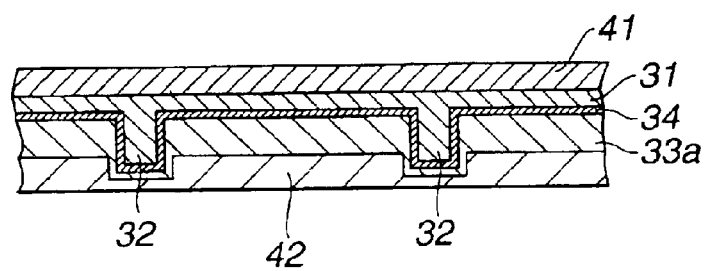
Figure 8C:
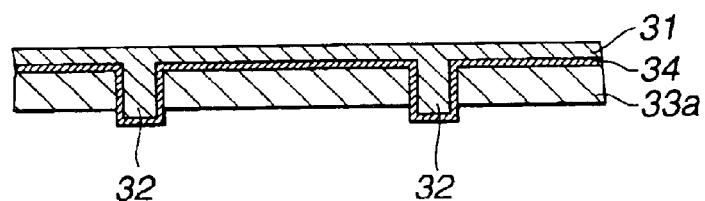

On the polyamic acid 33a, formed of semi-cured polyimide, a resist 42 is coated by a gravure roll to an as-dried thickness of approximately 8 µm, as shown in FIG. 8B. The resist 42 then is exposed to light and developed for patterning to a pre-set shape. The resist then is etched with alkali. This etching is executed until the distal ends of the bumps 32, 32 are exposed to outside for connection to the lands 23, 23 of the rigid substrate 2. That is, the resist 42 is of a reduced thickness above the bumps 32, 32, so that the distal ends of the bumps are exposed to outside via the polyamic acid 33a. The resist 42 then is peeled off, as shown in FIG. 8C. The carrier film 41 then is peeled from the copper foil 31, now carrying the semi-cured polyamic acid 33a.

The carrier film 41 is peeled form the copper foil 31 before turning the polyamic acid 33a into imide to prevent the adhesive used for bonding the copper foil 31 and the carrier film 41 together from being cured by the heating for turning into imide and to prevent melting of the carrier film 41.

Figure 9A:
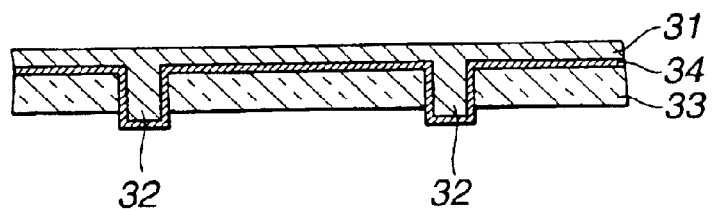
FIGS. 9A to 9C illustrate the manufacturing process of a flexible substrate, FIG. 9A being a cross-sectional view schematically showing the state in which the polyamic acid is turned into imide to form a first insulating layer composed of polyimide.

Then, as shown in FIG. 9A, the polyamic acid 33a is heated at approximately 350° C., after peeling the carrier film 41 from the copper foil 31, to turn it into imide, whereby a first insulating layer 33 formed of polyimide is deposited.

Figure 9B:
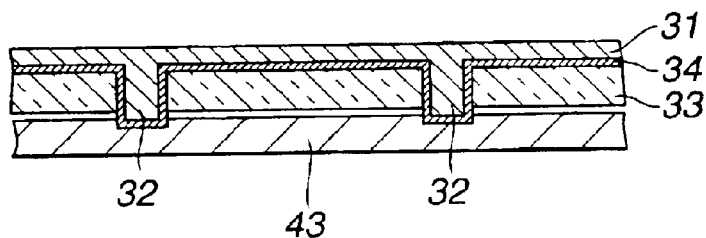

Then, as shown in FIG. 9B, a carrier film 43, similar to the carrier film 41, is bonded on the surface carrying the first insulating layer 33, by a UV curable adhesive.

Figure 9C:
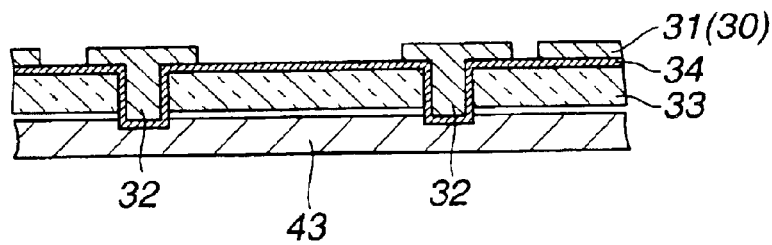

Then, as shown in FIG. 9C, a dry film is stuck to the copper foil 31, exposed to light and further etched, by way of patterning. This forms a wiring pattern 30 on the copper foil 31, while forming lands 38, 38 at the sites facing the bumps 38, 38.

Figure 10A:
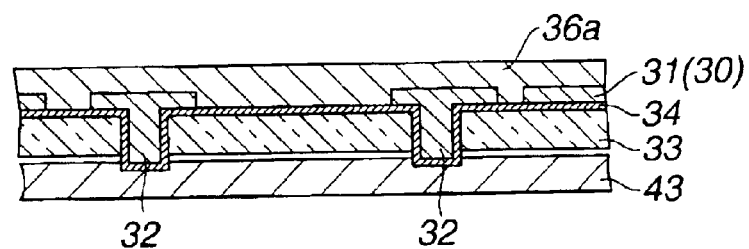
FIGS. 10A, 10B and 10C illustrate the manufacturing process of a flexible substrate, FIG. 10A being a cross-sectional view schematically showing the state in which polyamic acid is coated on the patterned copper foil.

Then, as shown in FIG. 10A, polyamic acid 36a is coated on the patterned copper foil 31, as shown in FIG. 10A. This polyamic acid 36a is dried until it is semi-cured. This gives the thickness of the as-dried polyamic acid 36a of approximately 8 µm.

Figure 10B:
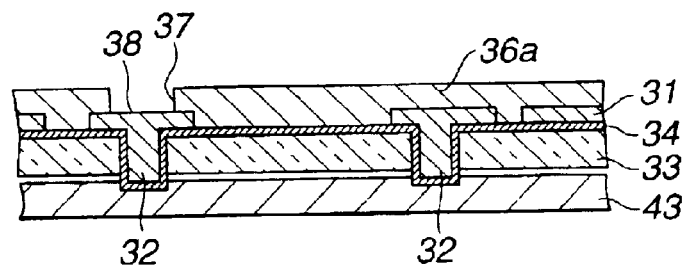

On the polyamic acid 36a, a resist, not shown, is coated, exposed, developed for patterning to a pre-set shape and subsequently etched with alkali. This exposes a portion of the copper foil 31 to outside to form lands 38, 38, as shown in FIG. 10B. The resist then is peeled off and the carrier film 43 then is peeled from the copper foil 31. Meanwhile, the carrier film 43 is peeled from the copper foil 31 before the polyamic acid 36a is turned into imide to prevent the adhesive used for bonding the copper foil 31 and the carrier film 43 from being cured due to heating at the time of conversion to imide, as well as to prevent the melting of the carrier film 43.

Figure 10C:
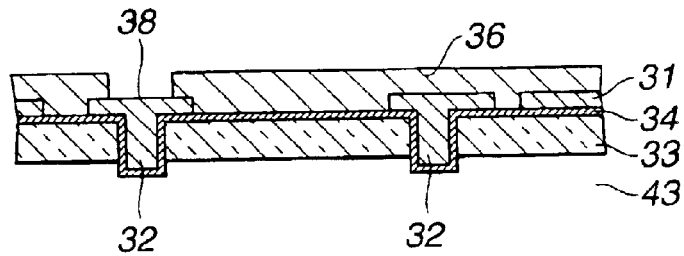

Then, as shown in FIG. 10C, the polyamic acid 36a is heated to approximately 320° C., for conversion to imide, after peeling off the carrier film 43 from the copper foil 31, whereby the second insulating layer 36 formed of polyimide is formed. The lands 38, 38 are then plated with gold, superior in electrically conductivity, to form a second plating layer 39, to permit layering on the rigid substrate 2, as shown in FIG. 4. Meanwhile, since polyimide forming the first and second insulating layers 33, 36 is of the polycondensation type, it is inferior in wettability. So, the surface of the first insulating layer 33, formed of polyimide, is processed with potassium permanagnate or $O_2$ plasma to improve adhesion characteristics.

For forming the bumps 32 on the c32, a plating method may also be used in place of the above-described etching method. Specifically, it is possible to form an insulating layer on the copper foil 31, to form a land-forming area by patterning the insulating layer and to allow the growth of copper in the land-forming area by the electrolytic copper plating method to form the bumps 32.

The bonding step of bonding the flexible substrates 3 to 6 to the rigid substrate 2, manufactured as described above, is hereinafter explained by referring to the drawings.

Figure 11A:
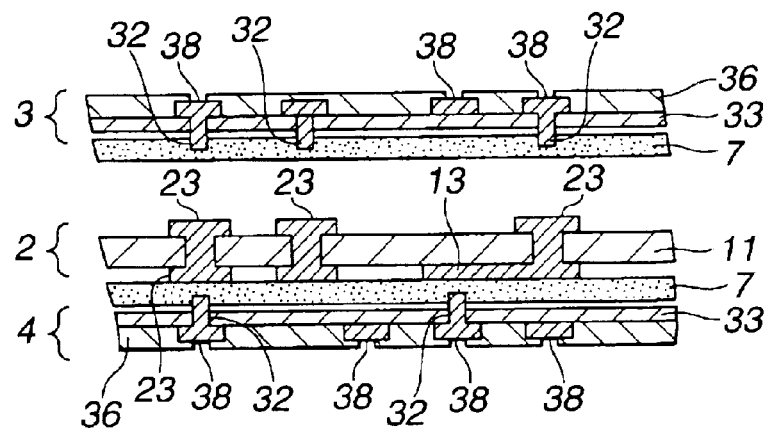
FIGS. 11A and 11B illustrate the process of bonding a rigid substrate and a flexible substrate together, FIG. 11A being a cross-sectional view schematically showing the state in which the flexible substrate as an inner layer substrata is bonded to the rigid substrate, and FIG. 11B being a cross-sectional view schematically showing the state in which the flexible substrate as an outer layer is bonded to a flexible substrate as an inner layer.
Figure 11B:
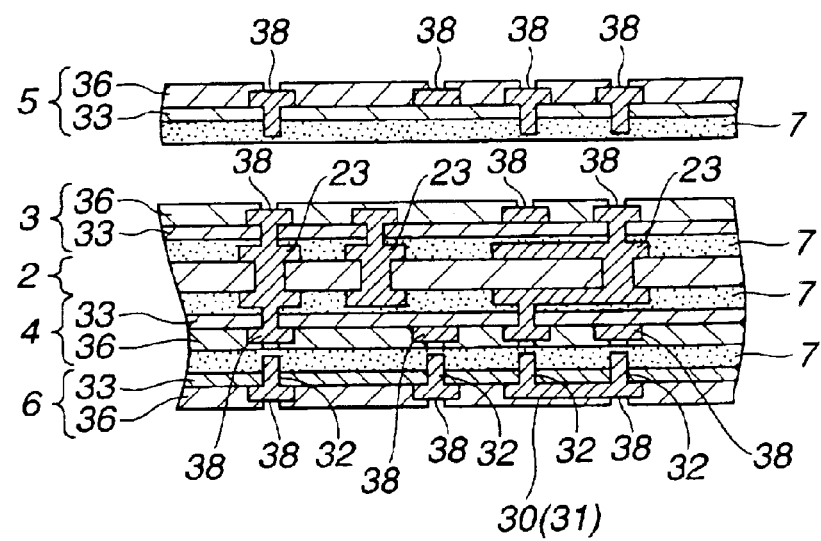

In this bonding step, the adhesive 7 is first coated on the surface of the flexible substrate 4 towards the first insulating layer 33, bonded to the other surface of the rigid substrate 2, as shown in FIG. 11A. The flexible substrate 4, thus coated with the adhesive 7, is stuck to the surface of the rigid substrate 2 towards the wiring pattern 13, so that the bump 32 will face the land 23. The adhesive 7 then is coated on the surface towards the first insulating layer 33 of the flexible substrate 3, bonded to one surface of the rigid substrate 2. The flexible substrate 4, coated with the adhesive 7, is stuck to the surface towards the wiring pattern 12 of the rigid substrate 2, so that the bump 32 will face the land 23. The flexible substrate 6, the first insulating layer 33 of which is coated with the adhesive 7, is then stuck to the flexible substrate 4, as shown in FIG. 11B, so that the bump 32 will face the land 38. The flexible substrate 5, the first insulating layer 33 of which is coated with the adhesive 7, is then stuck to the flexible substrate 3, so that the bump 32 will face the land 38. When the flexible substrates 3 to 6 are stuck in this manner to the flexible substrate 2, the flexible substrates 3 to 6 are stuck to the rigid substrate 2 exhibiting toughness, so that the bonding can be achieved readily without puckering.

Meanwhile, an anisotropic conduction film may also be provided between the bumps 32 and the lands 23, 32.

Figure 12:
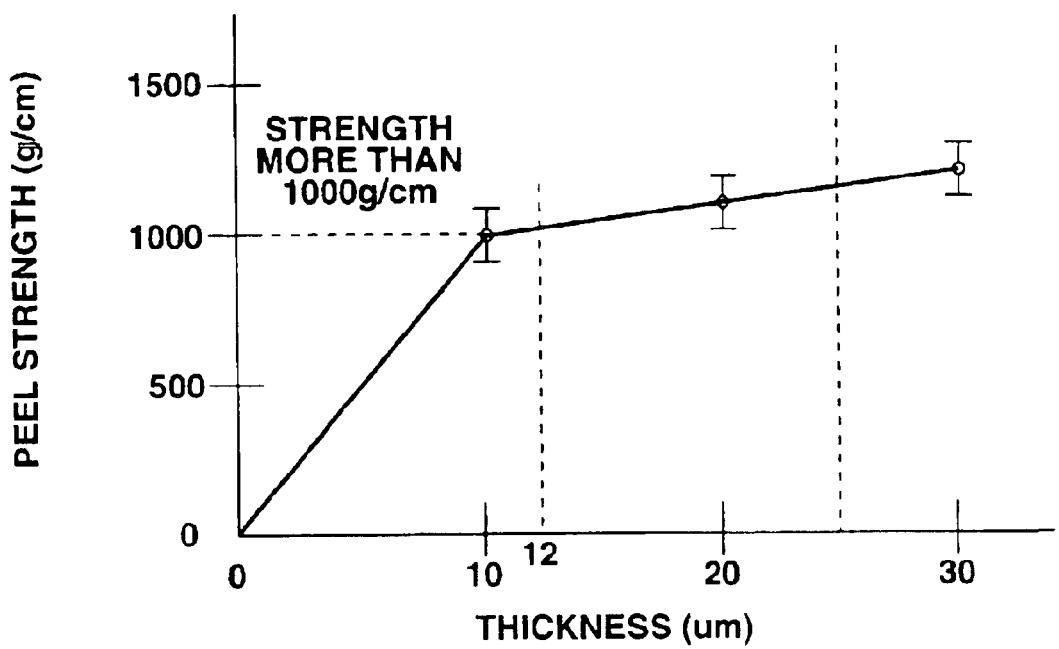
FIG. 12 is a graph showing the relation between the thickness of an adhesive used for bonding the substrates together and the peeling strength.

In view of pressing in the next step, a pressure sensitive adhesive is used for the adhesive 7. Since the solder temperature of the solder reflow in mounting electronic components reaches approximately 230° C., an adhesive superior in thermal resistance is used. Specifically, an epoxy acrylic adhesive is used as this adhesive 7. The adhesives 7, 7, 7, 7 are each formed to a thickness of 12 to 25 μm. That is, when the substrates are stuck to one another, as shown in FIG. 12, the peeling strength not less than approximately 1000 g/cm is required. So, the adhesive 7 needs to be of such a thickness as assures the minimum peeling strength, that is 12 μm or more. It is noted that the peeling strength of the adhesive 7 tends to be the higher the thicker becomes the adhesive layer. On the other hand, the thickness of the adhesive 7 needs to be sufficient to permit the bumps 32 to be protruded from the adhesive 7 when the substrates are bonded together. Thus, the thickness of the adhesive 7 is set to not more than 25 μm to assure reliable electrical connection of the lands 23, 38 with the bumps 32.

When the flexible substrates 3 to 6 are stuck to the rigid substrate 2 by the adhesive 7, these substrates are pressed together by a vacuum hot pressuring method. For example, this vacuum hot pressuring is performed under a condition of 180° C., 120 minutes and 40 kg/cm², the vacuum hot pressuring method is used to prevent air voids from being formed between the neighboring substrates during pressuring. The ultrasonic welding method, while being superior in the ohmic contact, is inferior to the vacuum hot pressuring method in making large-area connection. Meanwhile, the ultrasonic welding method may be applied to assure reliable ohmic contact after the vacuum hot pressuring.

The substrate prepared by bonding the flexible substrates 3 to 6 to the rigid substrate 2 by the adhesive 7 and by vacuum hot pressuring, is exteriorly worked by a metal mold pres or the router to complete the printed wiring board 1 shown in FIG. 1. On the printed wiring board 1, thus prepared, electronic components are mounted by a method such as solder reflow method. Since the through-hole 14 of the rigid substrate 2 is filled with the resin 17, the outer layers of the flexible substrates 5, 6 are smoothed to permit reliable mounting of the electronic components.

Table 1 below shows an illustrative manufacture of the printed wiring board 1.

TABLE 1

| | | | inventive | conventional |
|---|---|---|---|---|
| flexible substrate | wiring pattern | pattern width (μm) | 25 | 50 |
| | | pattern interval (μm) | 25 | 50 |
| | inner layer connection | land diameter (μm) | 70 | 500 |
| | | bump diameter (μm) | 35 | 200 |
| | insulating layer | material | polyimide | polyimide |
| | | thickness | 30 | 60 |
| rigid substrate | wiring pattern | pattern width (μm) | 50 | 100 |
| | | pattern interval (μm) | 50 | 100 |
| | inner layer connection | land diameter (μm) | 200 | 300 |
| | | bump diameter (μm) | 150 | 150 |
| | insulating layer | material | glass epoxy | glass epoxy |
| | | thickness | 100 | 130 |

As may be seen from Table 1, the wiring patterns 12, 13 and the lands 23 of the rigid substrate 2 and the wiring pattern 30 and the lands 38 of the flexible substrates 3 to 6 are finer than in the conventional rigid substrate or flexible substrate. It is thus seen that, in the printed wiring board 1 according to the present invention, the wiring pattern may be formed to a higher density in the printed wiring board 1 of the present invention than if plural rigid substrates are stacked to provide a multi-layered printed wiring board having plural conductive layers, as conventionally.

In the above-described manufacturing method for the printed wiring board 1, the rigid substrate 2 and the printed substrates 3 to 6 are prepared separately and unified ultimately together by vacuum hot pressuring to produce the printed wiring board 1 reduced in size and thickness as shown in FIG. 1. Since the technique of forming wiring patterns on both surfaces of the core material, bonding further core materials on both sides of the first-stated core material, now carrying the wiring patterns, and forming further wiring patterns on the second-stated core materials, such as is used in the conventional method for producing a multi-layered rigid substrate, is not used, each substrate which is to make up the printed wiring board 1 can be bonded in position after inspection, thus improving the production yield. Moreover, since the number of times of plating operations for the copper foil 31 in the case of the flexible substrates 3 to 6 is lesser than that in the case of the rigid substrate, the flexible substrates 3 to 6 may be of lesser thickness than the rigid substrate 2. Since the printed wiring board 1 is produced by layering these flexible substrates, it can be of a lesser thickness than the layered rigid substrate.

Figure 13:
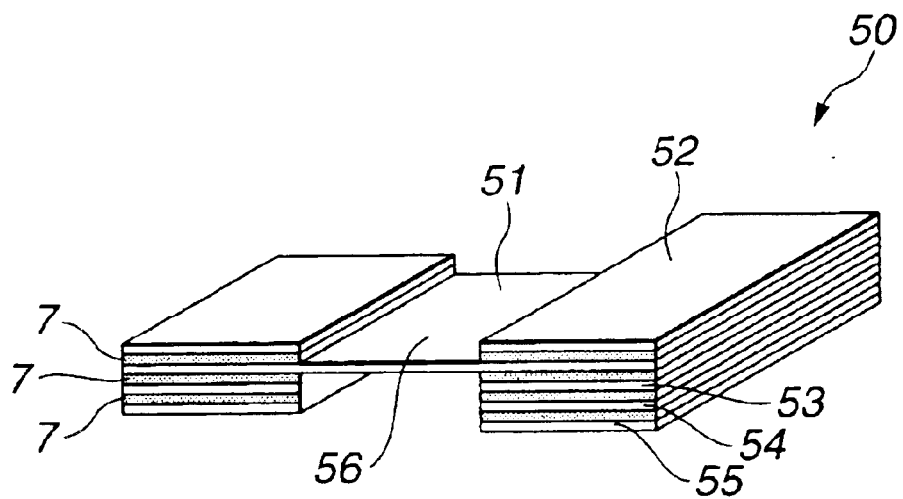
FIG. 13 is a perspective view showing a modification of the printed wiring board embodying the present invention.

Referring to FIG. 13, a modified embodiment of the printed wiring board according to the present invention is hereinafter explained. A printed wiring board 50, shown in FIG. 13, features layering flexible substrates 52 to 55 on both surfaces of a rigid substrate 51, a mid portion 56 of which is exposed to outside as shown. On one side of the rigid substrate 51, there is layered the flexible substrate 52, whereas, on the opposite side of the rigid substrate 51, there are layered the flexible substrates 53 to 55. The flexible substrates 52 to 55 are bonded by the above-mentioned adhesive 7 to the rigid substrate 51 and are unified thereto on vacuum hot pressuring. In the printed wiring board 51, electronic components can be mounted on the exposed portions 56 on both sides of the rigid substrate 51, whilst further electronic components may be mounted on the flexible substrates 52,55 forming the outer layers of the printed wiring board 50. One of the flexible substrates 52 to 55 may also be extended outwards from the substrate proper so as to be used for connection to the other electronic components. The method for producing the rigid substrate 51 and the flexible substrates 52 to 55 is similar to that for the rigid substrate 2 and the flexible substrate 3, described above, and hence is not explained specifically.

The present invention is not limited to the printed wiring board 1 explained above with reference to the drawings. For example, the rigid substrate 2 is not limited to a double side printed wiring board carrying wiring patterns 12, 13 on its both sides, such that a multi-layered rigid substrate carrying three or more conductive layers may also be used. The flexible substrate layered on the rigid substrate 2 may be formed in one or more layers on one or both sides of the rigid substrate 2.

What is claimed is:

1. A method for producing a printed wiring board comprising the steps of:
    forming a rigid substrate including a core material, said core material having a first core material surface and a second core material surface, said second core material surface being opposite to said first core material surface;
    forming a first land on said first core material surface;
    forming a flexible substrate including a bump, said flexible substrate having a metal layer, said metal layer having a first metal layer surface and a second metal layer surface, said second metal layer surface being opposite to said first metal layer surface;
    etching said first metal layer surface to form an etched portion of said metal layer;
    forming a first insulating layer within said etched portion of said metal layer, said bump being a portion of said metal layer that extends through said first insulating layer; and
    contacting said first land to said bump.

2. The method for producing a printed wiring board according to claim 1 further comprising the step of:
    forming an adhesive between said first insulating layer and said first core material surface;
    performing a vacuum hot pressuring method.

3. The method for producing a printed wiring board according to claim 2 further comprising the step of:
    performing an ultrasonic welding after performing said vacuum hot pressuring method.

4. The method for producing a printed wiring board according to claim 1 wherein said metal layer is copper.

5. The method for producing a printed wiring board according to claim 1 wherein said first conductive layer is copper.

6. The method for producing a printed wiring board according to claim 1 further comprising the step of:
    impregnating a glass cloth with an epoxy resin to form said core material.

7. The method for producing a printed wiring board according to claim 1 further comprising the steps of:
    forming a second land on a second core material surface of said core material, said second core material surface being opposite to said first core material surface;
    forming a through-hole extending from said first core material surface to said second core material surface; and
    plating said through-hole with a plating metal to form a plated through-hole.

8. The method for producing a printed wiring board according to claim 7 further comprising the step of:
    filling said plated through-hole with a resin.

9. The method for producing a printed wiring board according to claim 7 where in said plated through-hole electrically connects said first land to said second land.

10. The method for producing a printed wiring board according to claim 7 wherein the step of plating said through-hole is an electrolytic copper plating method.

11. The method for producing a printed wiring board according to claim 7 wherein the step of plating said through-hole is an electroless copper plating method.

12. The method for producing a printed wiring board according to claim 1 further comprising the step of:
    bonding a carrier film to said first insulating layer.

13. The method for producing a printed wiring board according to claim 12 further comprising the step of:
    patterning said second metal layer surface.

14. The method for producing a printed wiring board according to claim 12 further comprising the steps of:
    patterning said second metal layer surface to form a patterned second metal layer surface; and
    forming a second insulating layer on said patterned second metal layer.

15. The method for producing a printed wiring board according to claim 14 wherein the step of forming said second insulating comprising the steps of:
    coating said patterned second metal layer with polyamic acid; and
    heating said polyamic acid to form said second insulating layer.

16. The method for producing a printed wiring board according to claim 15 further comprising the steps of:
    patterning said second insulating layer to expose said patterned second metal layer;
    forming another metal layer, said another metal layer having another first metal layer surface and another second metal layer surface, said another second metal layer surface being opposite to said another first metal layer surface;
    etching said another first metal layer surface to form another etched portion of said another metal layer; and
    forming another first insulating layer within said another etched portion of said another metal layer, another bump being a portion of said another metal layer that extends through said another first insulating layer;
    contacting said patterned second metal layer to said another bump.

17. The method for producing a printed wiring board according to claim 16 further comprising the step of:
    forming an adhesive between said first insulating layer and said first core material surface;
    performing a vacuum hot pressuring method.

18. The method for producing a printed wiring board according to claim 17 further comprising the step of:
    performing an ultrasonic welding after performing said vacuum hot pressuring method.

19. The method for producing a printed wiring board according to claim 1 wherein the step of forming said first insulating comprising the steps of:
- coating said etched portion of said metal layer and bump with polyamic acid;
- coating said polyamic acid with a resist;
- etching said resist until the distal end of said bump is exposed;
- removing said resist; and
- heating said polyamic acid to form said first insulating layer.

20. The method for producing a printed wiring board according to claim 1 further comprising the step of:
- patterning said second metal layer surface.

21. The method for producing a printed wiring board according to claims 1 wherein prior to the step of etching said first metal layer surface of said metal layer, the method further comprising the step of:
- bonding a carrier film to said second metal layer surface.

22. The method for producing a printed wiring board according to claim 21 wherein said carrier film is a resin material.

23. The method for producing a printed wiring board according to claim 21 wherein after the step of forming said first insulating layer, the method further comprising the step of:
- removing said carrier film.

24. The method for producing a printed wiring board according to claim 1 further comprising the step of:
- forming a first plating layer on said bump.

25. The method for producing a printed wiring board according to claim 24 wherein said first plating layer is formed on said etched portion of said metal layer.

* * * * *

UNITED STATES PATENT AND TRADEMARK OFFICE
CERTIFICATE OF CORRECTION

PATENT NO. : 6,941,648 B2
DATED : September 13, 2005
INVENTOR(S) : Kazuhiro Shimizu et al.

It is certified that error appears in the above-identified patent and that said Letters Patent is hereby corrected as shown below:

Column 12,
Line 13, "where in" should read -- wherein --.

Signed and Sealed this

Eighteenth Day of April, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,941,648 B2 | Page 1 of 1 |
| APPLICATION NO. | : 10/364331 | |
| DATED | : September 13, 2005 | |
| INVENTOR(S) | : Kazuhiro Shimizu et al. | |

It is certified that error appears in the above-identified patent and that said Letters Patent is hereby corrected as shown below:

Title Page, Item (73) should read:

(73) Assignee:  Sony Corporation (JP)
                    Sony Chemicals Corporation (JP)

Signed and Sealed this
Twenty-seventh Day of November, 2012

David J. Kappos
*Director of the United States Patent and Trademark Office*